(12) United States Patent
Hara et al.

(10) Patent No.: US 10,199,199 B2
(45) Date of Patent: Feb. 5, 2019

(54) DRAWING DATA CREATION METHOD AND CHARGED PARTICLE BEAM DRAWING APPARATUS

(71) Applicant: NUFLARE TECHNOLOGY, INC., Yokohama-shi (JP)

(72) Inventors: Shigehiro Hara, Kawasaki (JP); Kenichi Yasui, Kawasaki (JP); Yasuo Kato, Yokohama (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 15/203,994

(22) Filed: Jul. 7, 2016

(65) Prior Publication Data

US 2017/0018404 A1    Jan. 19, 2017

(30) Foreign Application Priority Data

Jul. 16, 2015   (JP) ................................ 2015-142262

(51) Int. Cl.
*H01J 37/302*    (2006.01)
*H01J 37/317*    (2006.01)

(52) U.S. Cl.
CPC ...... *H01J 37/3026* (2013.01); *H01J 37/3174* (2013.01); *H01J 2237/31764* (2013.01); *H01J 2237/31766* (2013.01)

(58) Field of Classification Search
USPC ...................................................... 250/492.1
See application file for complete search history.

(56) References Cited

U.S. PATENT DOCUMENTS

| | | | | |
|---|---|---|---|---|
| 5,430,304 A | * | 7/1995 | Yasuda | ................. B82Y 10/00 250/396 R |
| 6,144,760 A | * | 11/2000 | Ohnuma | ............. G03F 7/70433 382/144 |

(Continued)

FOREIGN PATENT DOCUMENTS

| | | |
|---|---|---|
| JP | 10-229047 A | 8/1998 |
| JP | 11-102853 A | 4/1999 |

(Continued)

OTHER PUBLICATIONS

Takashi Kamikubo, et al., "Mask Process Correction (MPC) modeling and its application to EUV mask for Electron beam mask writer, EBM-7000", Proc. of SPIE, vol. 7823, 2010, 10 pgs.

(Continued)

*Primary Examiner* — Phillip A Johnston
(74) *Attorney, Agent, or Firm* — Oblon, McClelland, Maier & Neustadt, L.L.P.

(57) ABSTRACT

In one embodiment, a drawing data creation method includes inputting correction-map-including drawing data having a correction map to a converter, the correction map including dose amount information for each mesh area obtained by dividing a drawing area on a target drawn by a charged particle beam drawing apparatus, the drawing area being divided in a mesh shape, converting dose amount information in a second mesh area adjacent to a first mesh area to a representation based on dose amount information in the first mesh area to compress data of the dose amount information in the second mesh area, and outputting compressed-correction-map-including drawing data having a compressed correction map to a controller, the compressed correction map including dose amount information in which data in each of the plurality of mesh areas has been compressed.

11 Claims, 7 Drawing Sheets

(56) References Cited

U.S. PATENT DOCUMENTS

| | | | |
|---|---|---|---|
| 6,828,573 B1* | 12/2004 | Kawano | H01J 37/3023 250/492.22 |
| 9,779,913 B2* | 10/2017 | Hara | H01J 37/3026 |

FOREIGN PATENT DOCUMENTS

| | | |
|---|---|---|
| JP | 2003-77790 | 3/2003 |
| JP | 2005-215016 A | 8/2005 |
| JP | 2014-13793 A | 1/2014 |
| JP | 2015-095538 A | 5/2015 |

OTHER PUBLICATIONS

Office Action dated May 30, 2017 in Korean Patent Application No. 10-2016-0089131.

Office Action dated Sep. 25, 2018, in Japanese Patent Application No. 2015-142262, filed Jul. 16, 2015, citing documents AO and AP.

\* cited by examiner

FIG.5a
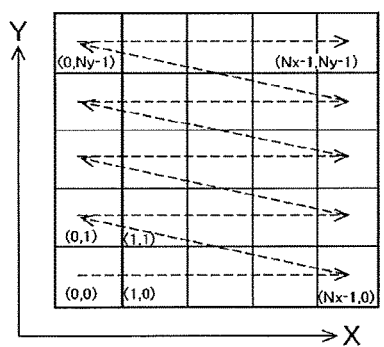
FIG.5b
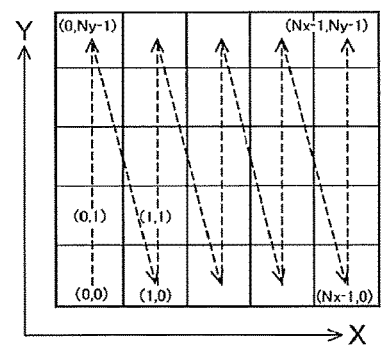
| | BEFORE COMPRESSION | AFTER COMPRESSION | | |
|---|---|---|---|---|
| | | HEADER FIELD | VALUE FIELD | NUMBER OF BITS |
| VALUE OF MESH (i, j) | 777 | 00 | 777 | 12 |
| VALUE OF MESH (i, j+1) | 775 | 01 | −2 | 8 |
| VALUE OF MESH (i, j+2) | 774 | 01 | −1 | 8 |
| VALUE OF MESH (i, j+3) | 774 | 11 | NONE | 2 |
| VALUE OF MESH (i, j+4) | 0 | 10 | NONE | 2 |
FIG.6

| | BEFORE COMPRESSION | AFTER COMPRESSION | | |
|---|---|---|---|---|
| | | HEADER FIELD | VALUE FIELD | NUMBER OF BITS |
| VALUE OF MESH (i, j) | 777 | 00 | 777 | 12 |
| VALUE OF MESH (i, j+1) | 757 | 10 | −20 | 8 |
| VALUE OF MESH (i, j+2) | 744 | 10 | −13 | 7 |
| VALUE OF MESH (i, j+3) | 735 | 01 | −9 | 7 |
| VALUE OF MESH (i, j+4) | 729 | 10 | −6 | 6 |
| VALUE OF MESH (i, j+5) | 719 | 11 | −10 | 7 |
| VALUE OF MESH (i, j+6) | 715 | 10 | −4 | 6 |
| VALUE OF MESH (i, j+7) | 715 | 10 | NONE | 2 |

|  | BEFORE COMPRESSION | AFTER COMPRESSION ||| 
|  |  | HEADER FIELD | VALUE FIELD | NUMBER OF BITS |
| --- | --- | --- | --- | --- |
| VALUE OF MESH (i, j) | 777 | 0 | 777 | 11 |
| VALUE OF MESH (i, j+1) | 757 | 1 | NONE | 1 |
| VALUE OF MESH (i, j+2) | 737 | 0 | 737 | 11 |
| VALUE OF MESH (i, j+3) | 726 | 1 | NONE | 1 |
| VALUE OF MESH (i, j+4) | 715 | 0 | 715 | 11 |
| VALUE OF MESH (i, j+5) | 715 | 1 | NONE | 1 |
| VALUE OF MESH (i, j+6) | 715 | 1 | NONE | 1 |
| VALUE OF MESH (i, j+7) | 715 | 1 | NONE | 1 |
| VALUE OF MESH (i, j+8) | 715 | 1 | NONE | 1 |
| VALUE OF MESH (i, j+9) | 715 | 0 | 715 | 11 |

|  | BEFORE COMPRESSION | AFTER COMPRESSION | | |
|---|---|---|---|---|
|  |  | HEADER FIELD | VALUE FIELD | NUMBER OF BITS |
| VALUE OF MESH (i, j) | 606 | 00 | 608 | 12 |
| VALUE OF MESH (i, j+1) | 595 | 10 | NONE | 2 |
| VALUE OF MESH (i, j+2) | 581 | 10 | NONE | 2 |
| VALUE OF MESH (i, j+3) | 565 | 00 | 566 | 12 |
| VALUE OF MESH (i, j+4) | 572 | 01 | +6 | 8 |
| VALUE OF MESH (i, j+5) | 573 | 01 | +1 | 8 |
| VALUE OF MESH (i, j+6) | 0 | 11 | NONE | 2 |
| VALUE OF MESH (i, j+7) | 0 | 11 | NONE | 2 |
FIG. 11
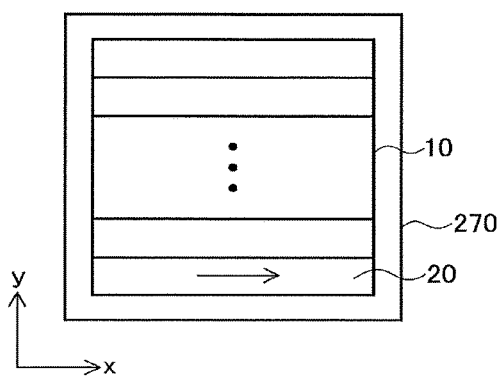
FIG.12a
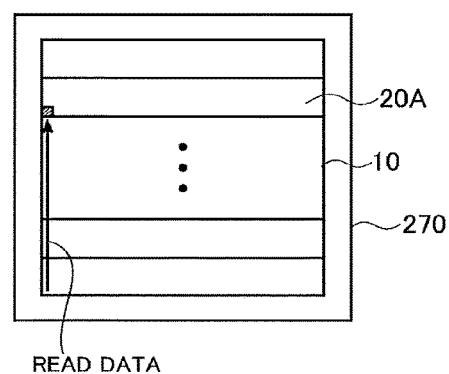
FIG.12b

DRAWING DATA CREATION METHOD AND CHARGED PARTICLE BEAM DRAWING APPARATUS

CROSS REFERENCE TO RELATED APPLICATION

This application is based upon and claims benefit of priority from the Japanese Patent Application No. 2015-142262, filed on Jul. 16, 2015, the entire contents of which are incorporated herein by reference.

FIELD

The present invention relates to a drawing data creation method and a charged particle beam drawing apparatus.

BACKGROUND

Along with high integration in LSIs, circuit line widths in semiconductor devices are becoming increasingly fine year by year. To form a desired circuit pattern on a semiconductor device, a method is used in which a high-precision original drawing pattern (also referred to as a mask or as a reticle particularly when the original drawing pattern is used by a stepper or scanner) formed on quartz is reduced and transferred to a wafer by using a reduction projection exposure apparatus. A high-precision original drawing pattern is drawn by an electronic beam drawing apparatus and a so-called electronic beam lithography technology is used.

When electronic beam drawing is performed, the layout of a semiconductor integrated circuit is designed first and layout data (design data) is created. Then, the layout data is converted to drawing data and the converted drawing data is input to an electronic beam drawing apparatus. The electronic beam drawing apparatus performs drawing according to the drawing data.

In electronic beam drawing, there are various phenomena that cause dimension variations; for example, an influence radius in a proximity effect is about 10 µm, and an influence radius in a fogging effect and a loading effect is about several mm. To suppress dimension variations due to these effects, dose amount correction computation has been performed in real time in the interior of the drawing apparatus.

As a phenomenon that causes a dimension variation, a proximity effect specific to an EUV mask with a very short influence radius of about 300 nm to 400 nm is known. When dose amount correction computation is performed with this effect taken into consideration, it is necessary to perform mesh division for a drawing area in units of, for example, about 50 nm to 100 nm and perform computation for each small divided area, so processing time in correction computation becomes vast. Since it is difficult to perform this type of computation in the interior of a drawing apparatus in real time, it is preferable to calculate the amount of correction in the outside in advance and input created correction information to the drawing apparatus.

As for correction information in a map form, however, the amount of data is large, so data transfer could not be efficiently performed. In addition, when mesh division is performed for a graphic and each small divided graphic has information about the amount of dose, the amount of data is increased according to the number of divisions.

BRIEF DESCRIPTION OF THE DRAWINGS

FIGS. 5a and 5b are drawings that indicate examples of mesh value definition orders.

FIG. 6 is a drawing that indicates an example of data compression in the first embodiment.

FIG. 11 is a drawing that indicates an example an example of data compression in a fourth embodiment.

FIGS. 12a and 12b are drawings that indicate division examples for a drawing area.

DETAILED DESCRIPTION

Figure 1:
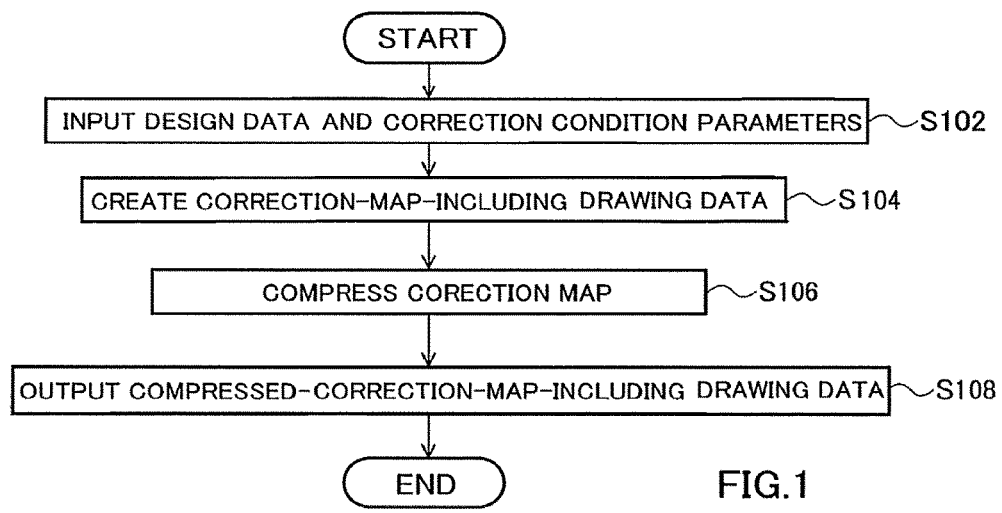
FIG. 1 is a flowchart that illustrates a data conversion method in a first embodiment.

In one embodiment, a drawing data creation method includes inputting correction-map-including drawing data having a correction map to a converter, the correction map including dose amount information for each mesh area obtained by dividing a drawing area on a target drawn by a charged particle beam drawing apparatus, the drawing area being divided in a mesh shape, converting dose amount information in a second mesh area adjacent to a first mesh area to a representation based on dose amount information in the first mesh area to compress data of the dose amount information in the second mesh area, and outputting compressed-correction-map-including drawing data having a compressed correction map to a controller, the compressed correction map including dose amount information in which data in each of the plurality of mesh areas has been compressed.

Embodiments of the present invention will be hereinafter explained with reference to drawings.

[First Embodiment]

FIG. 1 is a flowchart that illustrates a data compression method by which the data size of dose amount information that drawing data has, the drawing data being used to suppress a pattern dimension variation caused by a phenomenon in which an influence radius is small, is compressed and the compressed dose amount information is output. As indicated in FIG. 1, this method includes a process in which design data D1 and a correction condition parameter are input (step S102), a process in which drawing data that has dose amount information in a map form (correction map) is created (step S104), a process in which the correction map is compressed (step S106), and a process in which drawing data that has the compressed correction map is output (step S108).

Figure 2:
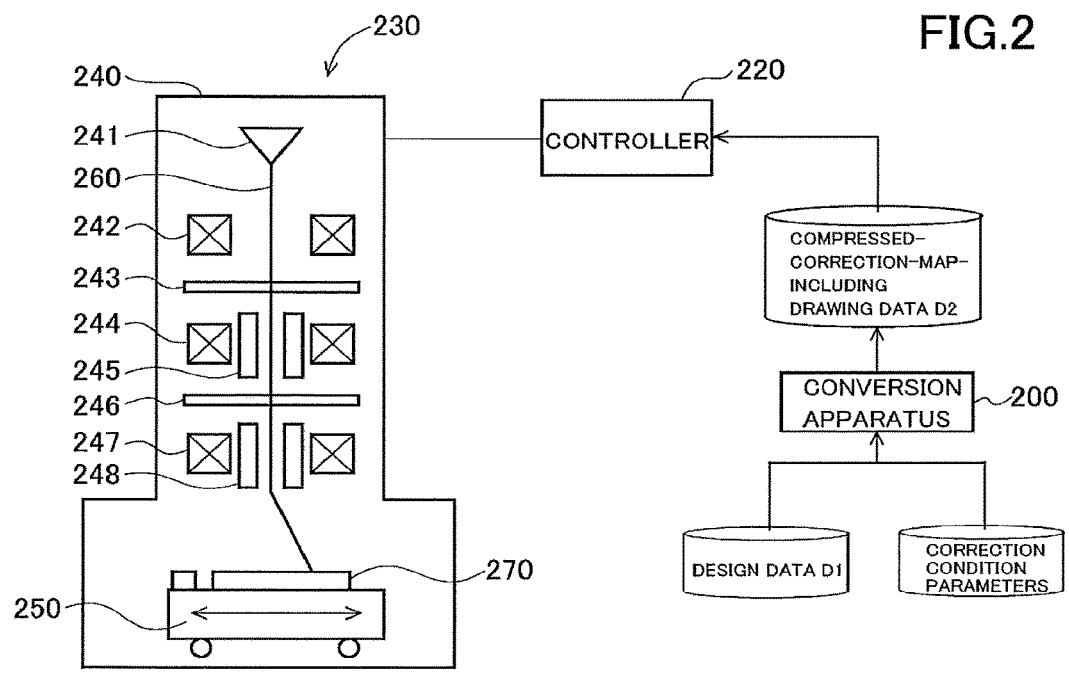
FIG. 2 is a drawing of the general structure of an electronic beam drawing system in the first embodiment.

FIG. 2 is a drawing of the general structure of an electronic beam drawing system. As indicated in FIG. 2, the electronic beam drawing system is equipped with a converter 200, a controller 220, and a drawing apparatus that has a drawing unit 230.

The drawing unit 230 has an electron beam column 240, an XY stage 250, an electron gun 241, an illumination lens 242, a first aperture 243, a projection lens 244, a deflector 245, a second aperture 246, an objective lens 247, and a deflector 248.

The converter 200 uses the design data D1 and correction condition parameter to create compressed-correction-map-including drawing data D2. The design data D1 is layout data based on the layout of a semiconductor integrated circuit. The design data D1 is converted so that it can be input to the drawing apparatus, by which drawing data is created. The correction map, which is set according to the correction condition parameter, is comprised of one file. In the compressed correction map, this correction map is compressed to reduce the amount of data.

The controller 220 performs data conversion processing, which is comprised of a plurality of steps, on drawing data to create shot data specific to the apparatus. The controller 220 also decompresses the compressed correction map and calculates the amount of dose for each mesh area with a predetermined size. The controller 220 controls the drawing unit 230 according the shot data and the calculated amount of dose and draws a desired graphic pattern on a mask substrate 270, which is a drawing target.

An electron beam 260 emitted from the electron gun 241 illuminates the whole of the first aperture 243, which has a rectangular hole, through the illumination lens 242. Here, the electron beam 260 is first shaped to a rectangular form. Then, the electron beam 260 in the form of a first aperture image, which has passed through the first aperture 243, is projected on the second aperture 246 by the projection lens 244. The position of the first aperture image on the second aperture 246 is controlled by the deflector 245, so the beam shape and size can be changed. The electron beam 260 in a second aperture image, which has passed through the second aperture 246, is focused by the objective lens 247, is deflected by the deflector 248, and illuminates a desired position on the mask substrate 270 on the XY stage 250, which is movably placed.

Figure 3:
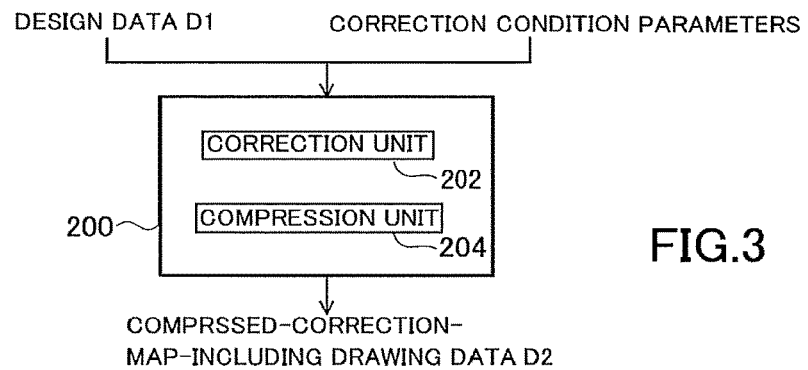
FIG. 3 is a block diagram of a converter in the first embodiment.

FIG. 3 is a block diagram of the conversion apparatus 200. The converter 200 is equipped with a correction unit 202, which uses the design data D1 and correction condition parameter to create a correction map and converts design data to drawing data, a compression unit 204, which compresses the correction map and creates the compressed-correction-map-including drawing data D2.

Figure 4:
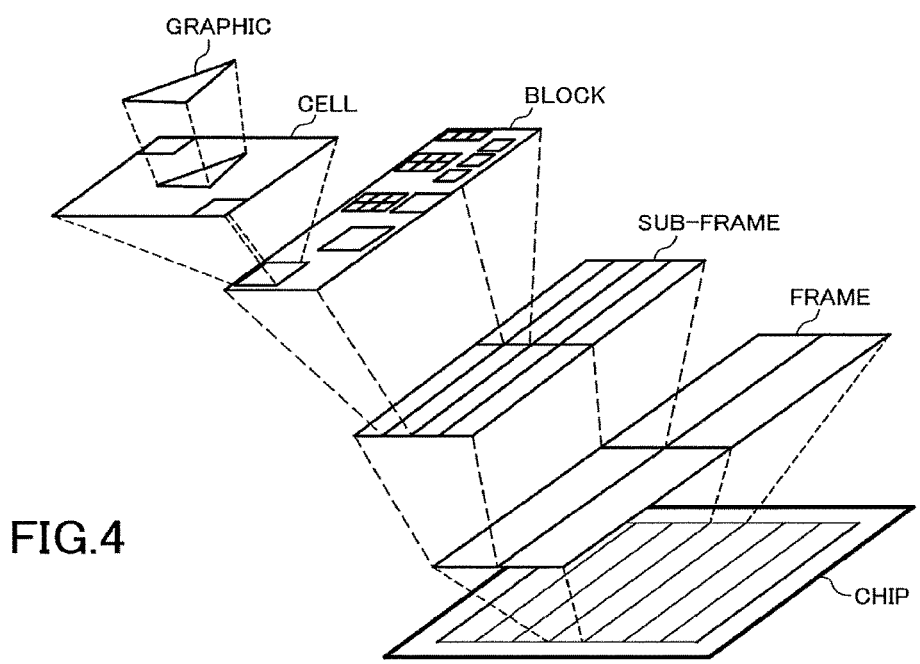
FIG. 4 is a drawing that indicates an example of the hierarchical structure of drawing data.

With the design data (layout data), a plurality of cells are placed on a chip and a graphic is placed on each cell. The correction unit 202 converts design data to drawing data in which the shape and position of the graphic are defined. In the drawing data, as indicated in FIG. 4, a drawing area has been hierarchized into a series of a plurality of internal structural units, which include a layer of a chip, a layer of frames, in which a chip area has been divided in a strip shape toward a certain direction (for example, y direction) parallel to a drawing plane, a layer of sub-frames, in which each frame area has been divided into areas with a predetermined size, a layer of blocks, in which each sub-frame area has been divided into areas with a predetermined size, a layer of cells described above, and a layer of graphics that form a cell.

As for the correction map, dose amount information (amount of dose or dose modulation ratio) has been defined as a mesh value for each mesh area obtained by dividing the drawing area in a mesh-like shape. The correction map has dose amount information used to suppress a dimension variation caused by a proximity effect specific to an EUV mask with a very short influence radius of 1 μm or less, for example, about 300 nm to 400 nm. Therefore, the mesh size is about one-tenth of the influence radius, for example, about 30 nm to 100 nm.

On the correction map, mesh values are arranged according to an order in which the mesh areas are defined. FIGS. 5a and 5b indicate examples of orders in which mesh areas are defined. In the example in FIG. 5b, for example, Nx×Ny mesh values are arranged sequentially, starting from the value of mesh (0, 0), followed by the value of mesh (0, 1), the value of mesh (0, 2), . . . , the value of mesh (0, Ny−1), the value of mesh (1, 0), . . . , and the value of mesh (Nx−1, Ny−1) in that order. If the data size of one mesh value is K bits, the data size of this correction map is K×Nx×Ny bits. The smaller the mesh size is, that is, the larger the number of mesh values is, the larger the data size of the correction map is. The compression unit 204 compresses the data size of this correction map.

The compression unit 204 represents the mesh value in one mesh area with a difference from the adjacent mesh area (immediately preceding mesh value). Therefore, the compression unit 204 converts a mesh value to a data structure comprised of a header field and a value field. An example of the header field and value field will be indicated in Table 1 below. In the example in Table 1, the mesh value before compression is assumed to be 10 bits long.

TABLE 1

| Header field (2 bits) | | |
|---|---|---|
| Value | Meaning | Value field |
| 00 | Full bits | Unsigned 10 bits |
| 01 | Difference representation | Signed 6 bits (1 bit of sign + 5 bits) |
| 10 | Zero | None (0 bit) |
| 11 | Same as preceding mesh value | None (0 bit) |

If the mesh value in a certain mesh area has a difference of a gray scale of 32 levels or less from the mesh value in the immediately preceding mesh area, the compression unit 204 represents this mesh value by using a two-bit header "01", which indicates that the value field is in a difference representation, and a value field of signed 6 bits, which indicates a difference from the mesh value in the immediately preceding mesh area. Due to this, the data size of the mesh value is reduced from 10 bits to 8 bits (=2 bits+6 bits).

The difference representation is not limited to signed 6 bits. It is only necessary for the number of bits to be smaller than full bits.

If the mesh value in a certain mesh area is 0, the compression unit 204 represents this mesh value by using only a two-bit header "10", which indicates that the value field is zero (there is no value field). Due to this, the data size of the mesh value is reduced from 10 bits to 2 bits.

If the mesh value in a certain mesh area is the same as the mesh value in the immediately preceding mesh area, the compression unit 204 represents this mesh value by using only a two-bit header "11", which indicates that the mesh value is the same as the mesh value in the immediately preceding mesh area. Due to this, the data size of the mesh value is reduced from 10 bits to 2 bits.

If the mesh value in a certain mesh area has a difference of a gray scale of more than 32 levels from the mesh value in the immediately preceding mesh area, the compression unit 204 takes this mesh value as the value field and adds a two-bit header "00", which indicates that the value field is in a full bit representation (unsigned 10 bits).

FIG. 6 indicates an example of conversion of mesh value representations by the compression unit 204. For convenience of explanation, FIG. 6 indicates mesh values before compression and the value field after compression in decimal notation, but binary notation is used in practice.

In mesh (i, j), the mesh value before compression is placed in the value field and the two-bit header "00", which indicates that the value field is in the full-bit representation (unsigned 10 bits), is added.

The mesh value of mesh (i, j+1) has a difference of a gray scale of 32 levels or less from the mesh value of mesh (i, j), so the header is "01", which indicates that the value field in the difference representation, and −2 (signed 6 bits), which is a difference from the mesh value of mesh (i, j), is placed in the value field.

The mesh value of mesh (i, j+2) has a difference of a gray scale of 32 levels or less from the mesh value of mesh (i, j+1), so the header is "01", which indicates that the value field in the difference representation, and −1 (signed 6 bits), which is a difference from the mesh value of mesh (i, j+1), is placed in the value field.

The mesh value of mesh (i, j+3) is the same as the mesh value of mesh (i, j+2), so the representation is converted to the two-bit header "11" alone.

The mesh value of mesh (i, j+4) is zero, so the representation is converted to the two-bit header "10" alone.

In the example indicated in FIG. 6, the data size of the five mesh values before compression was 10 bits×5=50 bits. By contrast, after compression, the data size was 12 bits+8 bits+8 bits+2 bits+2 bits=32 bits, so it was confirmed that the data size can be reduced.

The controller 220 in the drawing apparatus uncompresses the compressed correction map and obtains a mesh value (dose amount information) by using the value in the header field, the immediately preceding mesh value, the difference indicated in the value field, and the like.

Thus, in this embodiment, a mesh value in the correction map is represented as a difference from the mesh value in the adjacent mesh area, and the number of bits of the difference value is made smaller than the number of bits in the full representation. In addition, if the mesh value is zero or the same as the mesh value in the adjacent mesh area, the mesh value is represented by using only a header field that indicates this. Due to this type of conversion of a mesh value representation, the data size of the correction map can be reduced. Therefore, it is possible to improve the efficiency of data transmission to the controller 220 in the drawing apparatus.

The number of bits in the full-bit representation and difference representation for mesh values are not limited to the examples described above.

Correction-map-including drawing data, which has a correction map, may be created from the design data D1 and correction condition parameter by using a design tool, and the created correction-map-including drawing data may be output. Then, the converter 200 may compress the correction map of the correction-map-including drawing data to create the compressed-correction-map-including drawing data D2.

[Second Embodiment]

Although, in the first embodiment described above, the number of bits in the difference representation for mesh values has been fixed, the number of bits may be variable. An example of the header field and value field in a case in which the number of bits in the difference representation is variable will be indicated in Table 2 below and FIG. 7. In this example, the mesh value before compression is assumed to be 10 bits long.

TABLE 2

| Header field (2 bits) | | |
|---|---|---|
| Value | Meaning | Value field |
| 00 | Full bits | Unsigned 10 bits |
| 01 | Same number of bits as in the preceding mesh | Difference representation in which the number of bits is the same as in the value field in the preceding mesh. (Of these bits, one bit is a sign bit.) |
| 10 | The bit length is decreased by one step. | Difference representation in which the bit length is decreased by one step |
| 11 | The bit length is increased by one step. | Difference representation in which the bit length is increased by one step |

Figures 7, 8:
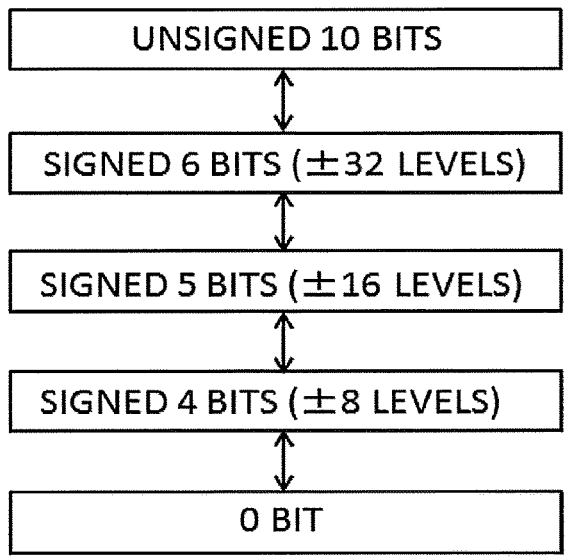
FIG. 7 is a drawing that indicates an example of an increasing and decreasing template for the number of bits in a difference representation.
FIG. 8 is a drawing that indicates an example of data compression in a second embodiment.

FIG. 7 is an example of an increasing and decreasing template for the number of bits in the difference representation. This type of increasing and decreasing template for the number of bits is defined in advance. The compression unit 204 changes the number of bits in the difference representation to convert representations for mesh values in the order of mesh areas, with reference to this template.

An example of conversion (data compression) of mesh value representations performed by the compression unit 204 is indicated in FIG. 8. For convenience of explanation, FIG. 8 indicates mesh values before compression and the value field after compression in decimal notation, but binary notation is used in practice.

In mesh (i, j), the mesh value is taken as the value field, and a two-bit header "00", which indicates that the value field is in the full-bit representation (unsigned 10 bits), is added.

The mesh value of mesh (i, j+1) has a difference of a gray scale of 32 levels or less from the mesh value of mesh (i, j), so two-bit "10", which indicates that the value field is in a difference representation in which the bit length is decreased by one step, is placed in the header field, and −20 (signed 6 bits), which is a difference from the mesh value of mesh (i, j), is placed in the value field.

The mesh value of mesh (i, j+2) has a difference of a gray scale of 16 levels or less from the mesh value of mesh (i, j+1), so the number of bits can be made smaller than in the difference representation for the mesh value of mesh (i, j+1). In the mesh value of mesh (i, j+2), therefore, two-bit "10", which indicates that the value field is in a difference representation in which the bit length is decreased by one step, is placed in the header field, and −13 (signed 5 bits), which is a difference from the mesh value of mesh (i, j+1), is placed in the value field.

The mesh value of mesh (i, j+3) has a difference of a gray scale of more than 8 levels but 16 levels or less from the mesh value of mesh (i, j+2), so the number of bits is the same as in the difference representation for the mesh value of mesh (i, j+2). In the mesh value of mesh (i, j+3), therefore, "01", which indicates a difference representation in which the number of bits is the same as in the value field in the preceding mesh, is placed in the header field, and −9 (signed 5 bits), which is a difference from the mesh value of mesh (i, j+2), is placed in the value field.

The mesh value of mesh (i, j+4) has a difference of a gray scale of 8 levels or less from the mesh value of mesh (i, j+3), so the number of bits can be made smaller than in the difference representation for the mesh value of mesh (i, j+3). In the mesh value of mesh (i, j+4), therefore, "10", which indicates that the value field is in a difference representation in which the bit length is decreased by one step, is placed in the header field, and −6 (signed 4 bits), which is a difference from the mesh value of mesh (i, j+3), is placed in the value field.

The mesh value of mesh (i, j+5) has a difference of a gray scale of more than 8 levels but 16 levels or less from the mesh value of mesh (i, j+4), so the number of bits needs to be made larger than in the difference representation for the mesh value of mesh (i, j+4). In the mesh value of mesh (i, j+5), therefore, "11", which indicates that the value field is in a difference representation in which the bit length is increased by one step, is placed in the header field, and −10 (signed 5 bits), which is a difference from the mesh value of mesh (i, j+4), is placed in the value field.

The mesh value of mesh (i, j+6) has a difference of a gray scale of 8 levels or less from the mesh value of mesh (i, j+5), so the number of bits can be made smaller than in the difference representation for the mesh value of mesh (i, j+5). In the mesh value of mesh (i, j+5), therefore, "10", which indicates that the value field is in a difference representation in which the bit length is decreased by one step, is placed in the header field, and −4 (signed 4 bits), which is a difference from the mesh value of mesh (i, j+5), is placed in the value field.

The mesh value of mesh (i, j+7) is the same as the mesh value of mesh (i, j+6), that is, the difference is 0, so further one-step reduction from signed 4 bits, which is the difference representation for the mesh value of mesh (i, j+6), is possible. In the mesh value of mesh (i, j+7), therefore, the representation is converted to the two-bit header "10" alone, which indicates that the value field is in a difference representation in which the bit length is decreased by one step.

In the example indicated in FIG. 8, the data size of the eight mesh values before compression was 10 bits×8=80 bits. By contrast, after compression, the data size was 12 bits+8 bits+7 bits+7 bits+6 bits+7 bits+6 bits+2 bits=55 bits, so it was confirmed that the data size can be reduced.

[Third Embodiment]

Although, in the first embodiment described above, a mesh value has been represented by a difference from the immediately preceding mesh value, a mesh value may be obtained by linear interpolation between a mesh value located one or more mesh values behind and a mesh value located one or more mesh values ahead.

The compression unit 204 converts a mesh value to a data structure comprised of a header field and a value field as indicated in Table 3 below. In the example in Table 3, the mesh value before compression is assumed to be 10 bits long.

TABLE 3

| Header field (1 bit) | | |
| --- | --- | --- |
| Value | Meaning | Value field |
| 0 | Interpolation end point (full bits) | Unsigned 10 bits |
| 1 | Within interpolation range | None (0 bit) |

Figures 9, 10:
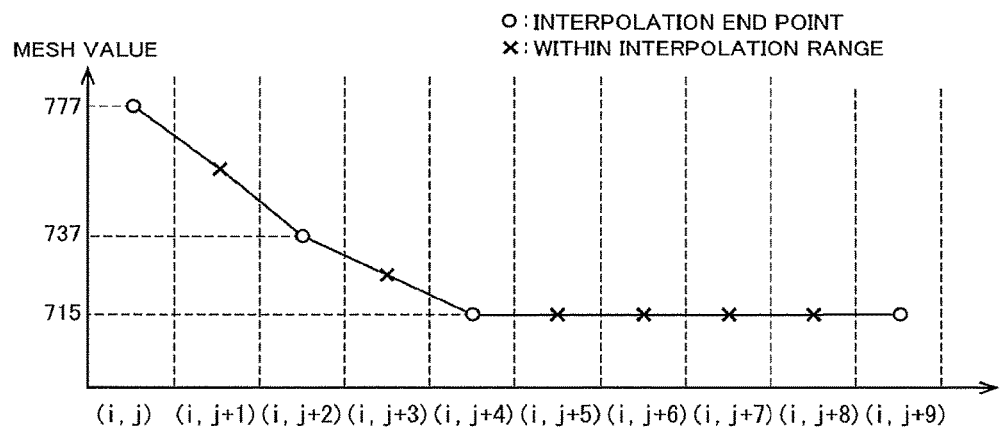
FIG. 9 is a drawing that indicates an example of data compression in a third embodiment.
FIG. 10 is a graph that indicates an example of data interpolation in the third embodiment.

An example of conversion (data compression) of mesh value representations performed by the compression unit 204 is indicated in FIG. 9. FIG. 10 is a graph on which mesh values are plotted. For convenience of explanation, FIGS. 9 and 10 indicate mesh values in decimal notation, but binary notation is used in practice.

When the mesh values of meshes (i, j) to (i, j+9) are viewed, the mesh value of mesh (i, j+1) is an intermediate value between the mesh value of mesh (i, j) and the mesh value of mesh (i, j+2). The mesh value of mesh (i, j+3) is also an intermediate value between the mesh value of mesh (i, j+2) and the mesh value of mesh (i, j+4). The mesh values of meshes (i, j+4) to (i, j+9) are the same.

In meshes (i, j), (i, j+2), (i, j+4), and (i, j+9), therefore, a one-bit header "0", which indicates an interpolation end point in the full bit representation (unsigned 10 bits) is added to the mesh value, resulting in 11-bit data.

The other meshes (i, j+1), (i, j+3), and (i, j+5) to (i, j+8) are within the interpolation range, so the representation is converted to one-bit header "1" alone.

In the example indicated in FIGS. 9 and 10, the data size of the mesh values in the ten mesh areas before compression was 10 bits×10=100 bits. By contrast, after compression, the data size was 11 bits×4+1 bit×6=50 bits, so it was confirmed that the data size can be reduced.

[Fourth Embodiment]

In linear interpolation in the third embodiment described above, mesh values in a plurality of contiguous mesh areas in the interpolation range may undergo function approximation by the least squares method to obtain the mesh values at interpolation end points from this approximate function. Mesh values in the interpolation range, which are located between two interpolation end points, are interpolated values by a linear expression that connects the two interpolation end points.

For example, the compression unit 204 performs approximation on the mesh values in meshes (i, j) to (i, j+3) by using the least squares method and obtains an approximate function U. The compression unit 204 corrects the mesh value M1 of mesh (i, j), which is an interpolation end point, and the mesh value M2 of mesh (i, j+3), which is an interpolation end point, to mesh values M1' and M2', respectively, which are obtained from an approximation function U. The mesh values of meshes (i, j+1) and (i, j+2) are obtained by linear interpolation for mesh values M1' and M2'.

Although, in the third embodiment described above, the header field has been one bit long and whether the mesh is an interpolation end point or within the interpolation range has been only distinguished, the header field may be two bits long and a mesh value may be converted to a data structure comprised of a header field and a value field as indicated in Table 4 below.

TABLE 4

| Header field (2 bits) | | |
| --- | --- | --- |
| Value | Meaning | Value field |
| 00 | Interpolation end point (full bits) | Unsigned 10 bits |
| 01 | Interpolation end point difference representation | Difference representation from the previous interpolation end point (signed 6 bits) |
| 10 | Within interpolation range | None (0 bit) |
| 11 | Zero | None (0 bit) |

An example of conversion (data compression) of mesh value representations performed by the compression unit 204 is indicated in FIG. 11. For convenience of explanation, FIG. 11 indicates mesh values before compression and the value field after compression in decimal notation, but binary notation is used in practice.

Mesh (i, j) and mesh (i, j+3) area interpolation end points and the header field is "00". When the mesh values of meshes (i, j) to (i, j+3) undergo function approximation by the least squares method, the mesh value of mesh (i, j) is approximated from 606 to 608 and the mesh value of mesh (i, j+3) is approximated from 565 to 566. In the value fields of mesh (i, j) and mesh (i, j+3), mesh values after correction are defined.

Meshes (i, j+1) and (i, j+2) are within the interpolation range, so the representation is converted to the two-bit header "10" alone.

The mesh value of mesh (i, j+4) has a difference of a gray scale of 32 levels or less from the mesh value of mesh (i, j+3), which is an interpolation end point, so "01", which indicates that the value field is in a difference representation, is placed in the header field, and +6 (signed 6 bits), which is a difference from the mesh value of mesh (i, j+3), is placed in the value field.

The mesh value of mesh (i, j+5) has a difference of a gray scale of 32 levels or less from the mesh value of mesh (i, j+4), so "01", which indicates that the value field is in a difference representation, is placed in the header field, and +1 (signed 6 bits), which is a difference from the mesh value of mesh (i, j+4), is placed in the value field.

The mesh values of meshes (i, j+6) and (i, j+7) are zero, so the representation is converted to the two-bit header "11" alone.

In the example indicated in FIG. 11, the data size of the mesh values in the eight mesh areas before compression was 10 bits×8=80 bits. By contrast, after compression, the data size was 12 bits×2+8 bits×2+2 bits×4=48 bits, so it was confirmed that the data size can be reduced.

In the fourth embodiment described above, the method of defining mesh areas to be grouped as an interpolation range is arbitrary. For example, mesh values undergo function approximation by the least squares method to obtain mesh values at interpolation end points from this approximate function, and a linear expression that connects the interpolation end points is calculated. The mesh value in each mesh area is obtained from this linear expression and an RMS (root mean square), which is error from the original mesh value, is obtained. As many mesh areas as possible are grouped as an interpolation range in a range within which this RMS is equal to or less than a predetermined value.

[Fifth Embodiment]

A correction map resulting from data compression performed in the compression method in the first to fourth embodiments described above includes meshes with different data lengths (data sizes). If, for example, compression is performed so as to have a data structure as indicated in Table 1, data corresponding to one mesh is 12 bits, 8 bits, or 2 bits long.

As indicated in FIG. 12a, the drawing unit 230 in the drawing apparatus virtually divides a drawing area 10 on the mask substrate 270 into a plurality of stripe areas 20 in a strip shape, each of which has a width within which deflection by the defector 248 is possible in the y direction, and makes drawing processing proceed for each stripe area 20. While the XY stage 250 is continuously moving toward, for example, the x direction, drawing is made to proceed toward the x direction for a first stripe area 20. After drawing in the first stripe area 20 has been terminated, drawing in a second stripe area 20 is made to proceed similarly or toward the opposite direction. After that, drawing is made to proceed similarly in third and subsequent stripe areas 20.

As described above, in the compressed correction map, mesh values are arranged in one direction (see FIGS. 5a and 5b) and the data sizes of mesh values are various. Therefore, when drawing is performed in a stripe area 20A in FIG. 12b, for example, to obtain the mesh value in the hatched portion in the drawing, mesh values need to be read in succession, starting from the first mesh value at the lower left of the drawing area 10, to obtain the mesh value, so additional time and effort are required.

Figure 13:
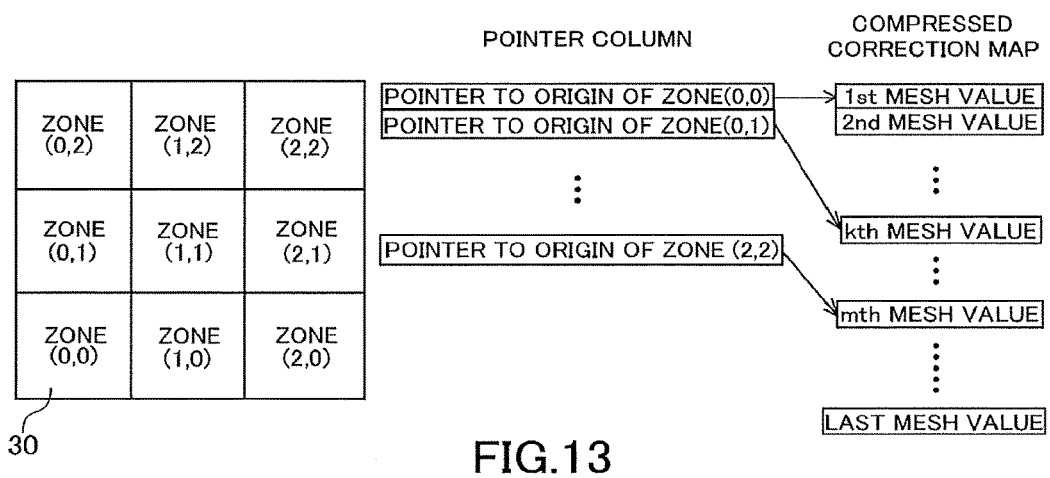
FIG. 13 is a drawing that indicates an example of pointers added to a compressed correction map.

Therefore, it is preferable to divide the drawing area 10 into a plurality of zones 30 larger than the mesh area and add pointers to compressed-correction-map-including drawing data, each pointer indicating a position, in the compressed correction map, at which data in the mesh area corresponding to the origin of each zone 30 is positioned, as indicated in FIG. 13. A plurality of mesh areas are included in each zone 30.

It is assumed that, in the mesh area corresponding to the origin of each zone 30, the mesh value is in the full-bit representation. This is because if the mesh value is not the full-bit representation, mesh values before the mesh value need to be read.

By referencing these pointer, the controller 220 can easily access the data in a mesh area for which to perform computation and the data processing efficiency can thereby be improved.

[Sixth Embodiment]

One of the compression methods in the first to fourth embodiment described above may be used to compress a correction map. Alternatively, a plurality of compression methods may be used and a compression method may be switched according to the area. When a plurality of compression methods are used, a compression type identification flag, which indicates a compression method for subsequent mesh values, and an index, which indicates the number of meshes that have been compressed by the compression method, are provided at a point at which the compression method is switched.

For example, it is assumed that: if the compression type identification flag is "00", the compression method in the first embodiment is used; if the compression type identification flag is "01", the compression method in the second embodiment is used; if the compression type identification flag is "10", the compression method in the third embodiment is used; and if the compression type identification flag is "11", the compression method in the fourth embodiment is used.

The controller 220 checks the contents of the index and uncompresses the compressed correction map.

The present invention may be applied not only to a variable shaped electron beam (VSB) drawing apparatus but also to a multi-beam drawing apparatus. Although, in the embodiments described above, a structure in which electron beams are used has been described as an example of charged particle beams, charged particle beams are not limited to electron beams. Other charged particle beams such as ion beams are possible.

At least part of the converter 200 described in the above embodiments may be implemented in either hardware or software. When implemented in software, a program that realizes at least part of functions of the converter 200 may be stored on a recording medium such as a flexible disk or CD-ROM and read and executed by a computer. The recording medium is not limited to a removable recording medium such as a magnetic disk or optical disk, but may be a non-removable recording medium such as a hard disk device or memory.

The program that realizes at least part of the functions of the converter 200 may be distributed through a communication line (including wireless communications) such as the Internet. Further, the program may be encrypted, modulated, or compressed to be distributed through a wired line or wireless line such as the Internet or to be distributed by storing the program on a recording medium.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A drawing data creation method comprising:
   inputting correction-map-including drawing data having a correction map to a converter, the correction map including dose amount information for each mesh area obtained by dividing a drawing area on a target drawn by a charged particle beam drawing apparatus, the drawing area being divided in a mesh shape, the correction map including a first mesh area and a second mesh area adjacent to the first mesh area;
   converting dose amount information in the second mesh area adjacent to the first mesh area to a representation based on dose amount information in the first mesh area to compress data of the dose amount information in the second mesh area to have a smaller data size than in the inputted correction-map-including drawing data; and
   outputting compressed-correction-map-including drawing data having a compressed correction map to a controller, the compressed correction map including dose amount information in which data in each of the plurality of mesh areas has been compressed and the compressed correction map having a smaller data size than the inputted correction map,
   wherein the dose amount information in the second mesh area is converted to a difference representation between the dose amount information in the first mesh area and the dose amount information in the second mesh area, and a data length of the difference representation is changed in accordance with a magnitude of a difference value.

2. The method according to claim 1, wherein the dose amount information, which has been compressed, in the second mesh area includes a value field and a header field that indicates whether the value field is in the full-bit representation, the value field is in a difference representation, the dose amount information in the second mesh area is zero, or the dose amount information in the second mesh area is the same as the dose amount information in the first mesh area.

3. The method according to claim 2, wherein the number of bits in the value field in the difference representation is smaller than the number of bits in the value field in the full-bit representation.

4. The method according to claim 1, wherein the dose amount information, which has been compressed, in the second mesh area includes a value field and a header field that indicates whether the value field is in a full-bit representation, the value field is in a difference representation in which the number of bits is the same as in the value field in compressed dose amount information in the first mesh area, the value field is in a difference representation in which the number of bits is decreased one step when compared with the value field in the compressed dose amount information in the first mesh area, or the value field is in a difference representation in which the number of bits is increased one step when compared with the value field in the compressed dose amount information in the first mesh area.

5. The method according to claim 1, wherein:
   the correction map includes a third mesh area, a fourth mesh area, and a fifth mesh area located between the third mesh area and the fourth mesh area; and
   the dose amount information in the fifth mesh area is converted to a representation indicating that the dose amount information in the fifth mesh area is determined by performing linear interpolation on the dose amount information in the third mesh area and the dose amount information in the fourth mesh area.

6. The method according to claim 5, wherein a linear expression that approximates the dose amount information in the third mesh area, fourth mesh area, and fifth mesh area is obtained, and the dose amount information in the third mesh area and fourth mesh area are corrected to a value obtained from the linear expression.

7. The method according to claim 1, wherein a pointer is added to the compressed-correction-map-including drawing data and is then output, the pointer indicating a position, in the compressed correction map, at which data in a mesh area corresponding to an origin of each zone is positioned when the drawing area is divided into a plurality of zones larger than the mesh area.

8. The method according to claim 7, wherein the dose amount information in the mesh area corresponding to the origin of each zone has been in the full-bit representation.

9. A charged particle beam drawing apparatus comprising:
   a drawing device including a charged particle beam column and a stage, and drawing a pattern in a drawing area of a substrate on the stage by using a charged particle beam which has illuminated and has passed through the charged particle beam column; and
   a controller including a programmable computer that is programmed to perform accepting compressed-correction-map-including drawing data having a compressed correction map, the compressed correction map including dose amount information for each mesh area obtained by dividing the drawing area in a mesh shape, dose amount information in a second mesh area adjacent to a first mesh area having been converted to a representation based on dose amount information in the first mesh area so as to be data-compressed to have a reduced data size, uncompressing the compressed correction map to calculate an amount of dose, and controlling the drawing device based on the calculated amount of dose and shot data created based on a data conversion processing performed on the drawing data,
   wherein the dose amount information in the second mesh area has been converted to a difference representation between the dose amount information in the first mesh area and the dose amount information in the second mesh area so as to be data-compressed, and a data length of the difference representation has been changed in accordance with a magnitude of a difference value.

10. The apparatus according to claim 9, wherein:
the dose amount information, which has been compressed, in the second mesh area includes a value field and a header field that indicates whether the value field is in a full-bit representation, the value field is in a difference representation, the dose amount information in the second mesh area is zero, or the dose amount information in the second mesh area is the same as the dose amount information in the first mesh area; and
the controller obtains the dose amount information in the second mesh area by using a value in the header field, a value in the value field, and the dose amount information in the first mesh area.

11. The apparatus according to claim 9, wherein:
a fifth mesh area is located between a third mesh area and a fourth mesh area; and
the controller obtains the dose amount information in the fifth mesh area by performing linear interpolation on the dose amount information in the third mesh area and the dose amount information in the fourth mesh area.

\* \* \* \* \*